United States Patent
Arai et al.

(10) Patent No.: US 9,608,410 B2
(45) Date of Patent: Mar. 28, 2017

(54) SURFACE-EMITTING LIGHT SOURCE AND LASER APPARATUS

(71) Applicants: Nobuyuki Arai, Kanagawa (JP);
Keisuke Ikeda, Kanagawa (JP);
Kenichi Shimizu, Kanagawa (JP)

(72) Inventors: Nobuyuki Arai, Kanagawa (JP);
Keisuke Ikeda, Kanagawa (JP);
Kenichi Shimizu, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/918,809

(22) Filed: Oct. 21, 2015

(65) Prior Publication Data
US 2016/0134076 A1    May 12, 2016

(30) Foreign Application Priority Data
Nov. 10, 2014    (JP) .................. 2014-227734

(51) Int. Cl.
*H01S 5/42*    (2006.01)
*H01S 5/024*    (2006.01)
*H01S 5/022*    (2006.01)
*H01S 5/40*    (2006.01)

(52) U.S. Cl.
CPC .......... *H01S 5/423* (2013.01); *H01S 5/02288* (2013.01); *H01S 5/02284* (2013.01); *H01S 5/02415* (2013.01); *H01S 5/4012* (2013.01)

(58) Field of Classification Search
CPC ............................. H01S 3/06708; H01S 5/183
See application file for complete search history.

(56) References Cited

U.S. PATENT DOCUMENTS

| | | | |
|---|---|---|---|
| 5,986,996 A * | 11/1999 | Kitamura | G11B 7/0037 369/112.12 |
| 2006/0215966 A1* | 9/2006 | Nagano | G02B 6/4206 385/88 |
| 2008/0204842 A1 | 8/2008 | Arai et al. | |
| 2008/0267662 A1 | 10/2008 | Arai et al. | |

FOREIGN PATENT DOCUMENTS

| | | |
|---|---|---|
| JP | 2001-305014 | 10/2001 |
| JP | 2002-026452 | 1/2002 |
| JP | 2002-048639 | 2/2002 |
| JP | 2002-076490 | 3/2002 |
| JP | 2002-169115 | 6/2002 |
| JP | 2003-166902 | 6/2003 |

* cited by examiner

*Primary Examiner* — Dung Nguyen
(74) *Attorney, Agent, or Firm* — Oblon, McClelland, Maier & Neustadt, L.L.P.

(57) ABSTRACT

A surface-emitting light source includes a substrate including a light emitting region where plural light emitting points are disposed and a non-light emitting region located around the light emitting region; and a lens array including plural lenses and a non-lens region around the plural lenses. The substrate and the lens array are directly bonded with each other at the non-light emitting region and the non-lens region such that the plural light emitting points and the plural lenses face each other, and the lens array has a linear expansion coefficient not greater than a linear expansion coefficient of the substrate.

11 Claims, 9 Drawing Sheets

SURFACE-EMITTING LIGHT SOURCE AND LASER APPARATUS

CROSS-REFERENCE TO RELATED APPLICATIONS

This patent application is based on and claims priority pursuant to 35 U.S.C. §119 to Japanese Patent Application No. 2014-227734, filed on Nov. 10, 2014, in the Japan Patent Office, the entire disclosure of which is hereby incorporated by reference herein.

BACKGROUND

Technical Field

The present invention relates to a surface-emitting light source and a laser apparatus.

Description of the Related Art

A high-power surface emitting light source formed of a vertical cavity-surface emitting laser (hereinafter referred to as "VCSEL") and a micro lens array collimating a light flux from the VCSEL is known.

The VCSEL faces a lens array in which plural lenses are disposed. A light flux having entered the lens array enters an optical fiber through a condenser optical system. When the VCSEL has light emitting points formed at high density, a heat generated at the light emitting points is transmitted to the lens array, thus occasionally deforming the lens array. When the lens array is deformed, light quantity entering the optical fiber decreases, i.e., light use efficiency in the optical fiber decreases.

SUMMARY

A surface-emitting light source including a substrate including a light emitting region where plural light emitting points are disposed and a non-light emitting region located around the light emitting region; and a lens array including plural lenses and a non-lens region around the plural lenses, wherein the substrate and the lens array are directly bonded with each other at the non-light emitting region and the non-lens region such that the plural light emitting points and the plural lenses face each other, and the lens array has a linear expansion coefficient not greater than a linear expansion coefficient of the substrate.

BRIEF DESCRIPTION OF THE DRAWINGS

Various other objects, features and attendant advantages of the present invention will be more fully appreciated as the same becomes better understood from the detailed description when considered in connection with the accompanying drawings in which like reference characters designate like corresponding parts throughout and wherein.

DETAILED DESCRIPTION

Accordingly, one object of the present invention is to provide a surface-emitting light source having high light use efficiency even when a light emitting point equipped in a VCSEL generates heat.

Another object of the present invention is to provide a lase apparatus using the surface-emitting light source.

Exemplary embodiments of the present invention are described in detail below with reference to accompanying drawings. In describing exemplary embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

•Laser Apparatus•

Figure 1A:
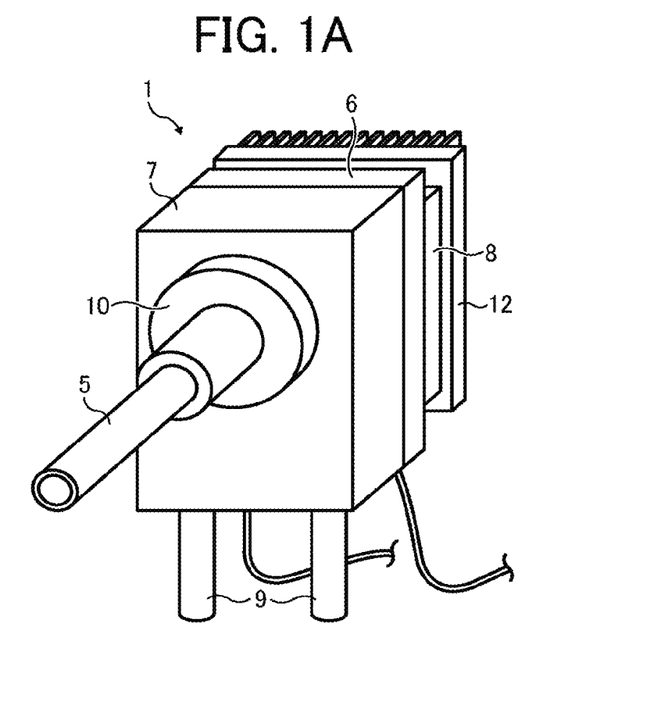
FIG. 1A is a perspective view illustrating an embodiment of a laser apparatus according to an embodiment of the present invention.
Figure 1B:
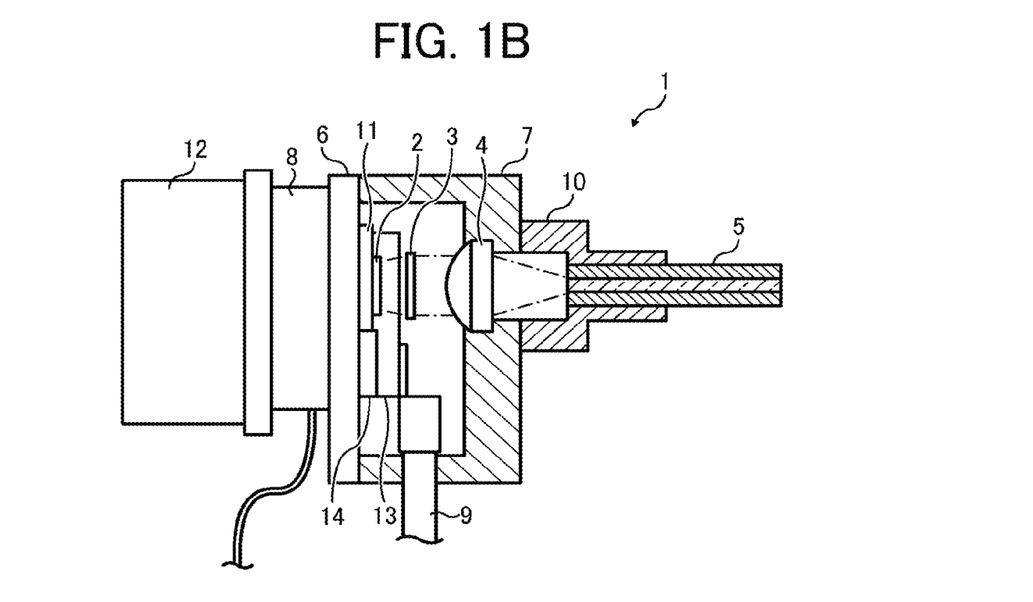
FIG. 1B is a longitudinal sectional view of the laser apparatus of FIG. 1A.

As shown in FIGS. 1A and 1B, a lase apparatus 1 is equipped with a VCSEL 2, a micro lens array 3, a condenser lens 4, an optical fiber 5 and a housing 7. The VCSEL 2, the micro lens array 3 and the condenser lens 4 are contained in the housing 7.

As shown in FIG. 1A, the housing 7 is equipped with an optical fiber holding member 10. The optical fiber holding member 10 is formed of a plurality of cylinders having different inner diameters and that are joined together. The cylinder having the largest inner diameter has a bottom face attached to the housing 7. The cylinder having the smallest inner diameter holds the optical fiber 5. The inside of the optical fiber holding member 10 and the inside of the housing 7 are communicated with each other. The optical fiber 5 may be connected with an outside laser use apparatus (apparatus that uses laser) such as a laser beam machine or an engine ignition plug using laser. The optical fiber 5 receives a light flux emitted from the condenser lens 4 and transmits the light flux to the outside laser use apparatus.

The surface of the other side of the housing 7 opposite to the surface the optical fiber holding member 10 is joined to is covered with a heat diffusion plate 6. A Peltier element 8 and a heat sink 12 are joined to the outer surface of the heat diffusion plate 6 in this order. The heat diffusion plate 6 transmits a heat from the VCSEL 2 mentioned later in detail to the outside of the housing 7. The heat diffusion plate 6 is formed of a high heat-conductive material such as copper.

The heat diffusion plate 6 is adjacent to an endothermic surface of the Peltier element 8 at the outer surface of the housing 7, and is cooled by the Peltier element 8.

The heat sink 12 is located on a radiation surface of the Peltier element 8. The heat sink 12 radiates heat from the VCSEL 2 and the Peltier element 8 in the atmosphere. The heat sink 12 may radiate heat by natural convection or forced convention using blower fans, etc. When the Peltier element 8 is not needed as ambient air has a sufficiently low temperature, the heat sink 12 may directly cool the heat diffusion plate 6.

As shown in FIG. 1B, the VCSEL 2 is disposed on the surface of the heat diffusion plate 6 facing the inside of the housing 7. In front of an optical axial direction of the VCSEL 2, the micro lens array 3, the condenser lens 4 and the optical fiber 5 are located in this order. The optical elements from the VCSEL 2 to the optical fiber 5 are integrally held by the housing 7. The VCSEL 2 is held at a mount 11. An insulating plate is disposed between the VCSEL electrode 13 and the heat diffusion plate 6.

Figure 2:
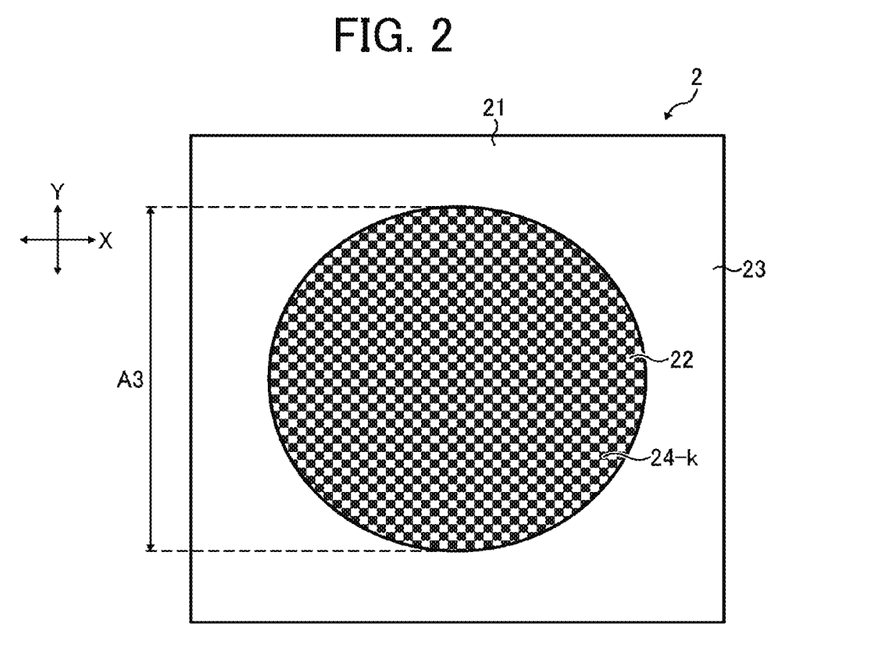
FIG. 2 is a front view illustrating a VCSEL equipped in the laser apparatus of FIG. 1A.

As shown in FIG. 2, the VCSEL 2 is formed of a square VCSEL substrate 21 on which a light emitting region 22 and a non-light emitting region 23 are formed. The light emitting region 22 has the shape of a circle having a diameter of 8.9 mm. Many light emitting points 24-$k$ are provided in the light emitting region 22 at even intervals of 48 μm between the centers of the adjacent emitting points. In the embodiment, about 33,600 light emitting points 24-$k$ are provided. Each of the light emitting points 24-$k$ has the shape of a circle having a diameter of 9 μm.

Figure 3:
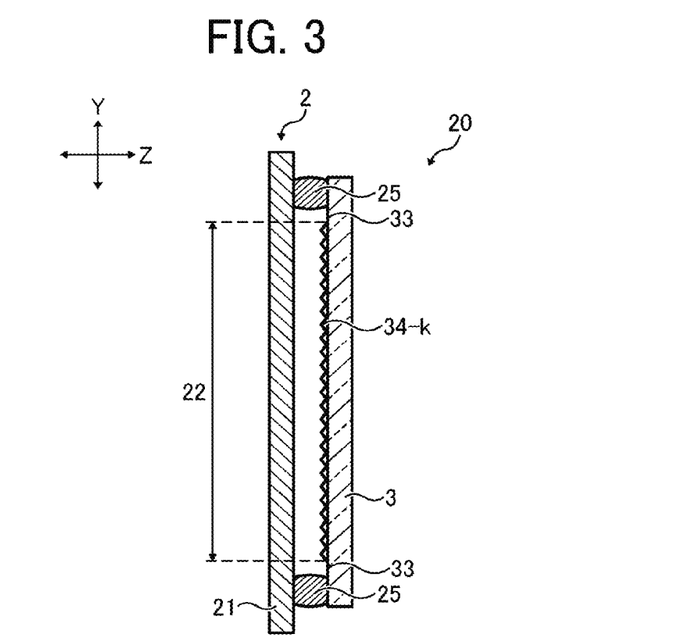
FIG. 3 is a side view illustrating a surface-emitting light source constituted of the VCSEL and the micro lens array of FIG. 2.

As shown in FIG. 3, the micro lens array 3 includes plural lenses 34-$k$ and a non-lens region 33 around the plural lenses 34-$k$. The micro lens array 3 is a square member slightly smaller than the VCSEL substrate 21. The plural lenses 34-$k$ are formed of, for example, synthetic quartz having a focal length (f) of 0.1 mm.

The plural lenses 34-$k$ are disposed so as to each face the corresponding one of the light emitting points 24-$k$. Specifically, they are bonded with each other such that XY coordinates of each of the light emitting points 24-$k$ and XY coordinates of each of surface tops of the plural lenses 34-$k$ of the micro lens array 3 match with each other. The XY flat surface is perpendicular to an optical axis direction of the VCSEL 2. The VCSEL 2 and the micro lens array 3 constitutes a surface-emitting light source 20.

The VCSEL substrate 21 and the micro lens array 3 are bonded with each other with an adhesive 25. They are bonded with each other such that XY coordinates of each of the light emitting points 24-$k$ and XY coordinates of each of surface tops of the plural lenses 34-$k$ of the micro lens array 3 match with each other. Namely, each of the surface tops of the plural lenses 34-$k$ are located so as to be identical with an optical axis of each of the light emitting points 24-$k$.

Each of the lenses 34-$k$ has a convex surface facing the light emitting point 24-$k$. That is, the convex surface of each lens 34-$k$ is disposed so as to face the light emitting point 24$k$. This decreases influence of bend of the micro lens array 3 when deformed due to heat, thus suppressing reduction in light use efficiency due to temperature variation. The light use efficiency is a ratio of incident light quantity to the optical fiber 5 to a light quantity of the VCSEL 2.

The VCSEL substrate 21 and the micro lens array 3 are directly bonded with each other at the non-light emitting region 23 and the non-lens region 33 with the adhesive 25. Namely, the micro lens array 3 is not directly fixed to the light emitting point 24-$k$. Therefore, a heat from the light emitting point 24-$k$ hardly transmits to the micro lens array 3.

The adhesive 25 may be a UV curing resin typically used. The use of resin for the adhesive 25 makes heat difficult to transmit from the VCSEL substrate 21 to the micro lens array 3. The adhesive 25 may be a solder. Since the solder has a liner expansion coefficient smaller than that of a resin, even when the light emitting point 24-$k$ generates heat due to light emission, a space between the VCSEL substrate 21 and the micro lens array 3 is difficult to vary.

Figure 4:
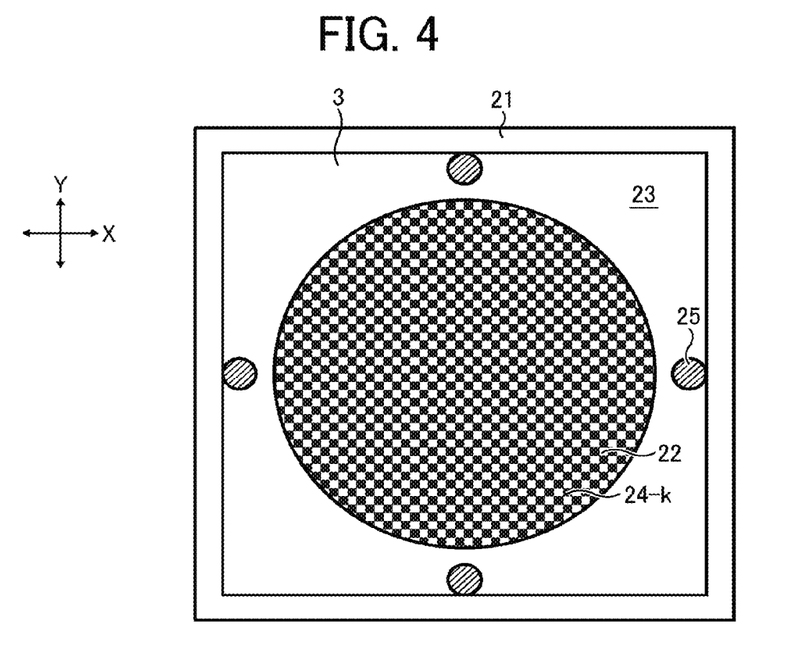
FIG. 4 is a front view illustrating the surface-emitting light source of FIG. 3.

As shown in FIG. 4, the adhesive 25 is placed at the non-light emitting region 23 of the VCSEL substrate 21. The adhesive 25 is placed at 4 positions that are symmetrical in a vertical direction and a horizontal direction relative to the center of the light emitting region 22. In the embodiment, the adhesive 25 is located above, below, to the left and to the right of the light emitting region 22. This suppresses the micro lens array 3 from inclining relative to the VCSEL substrate 21 due to expansion and contraction of the adhesive 25.

Figure 5:
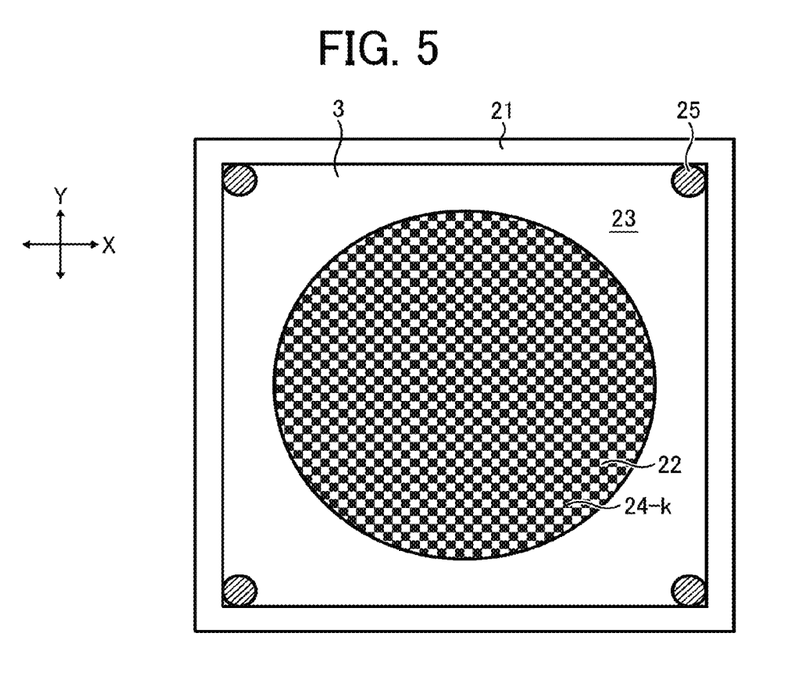
FIG. 5 is a front view illustrating a surface-emitting light source according to an embodiment of the present invention.

As shown in FIG. 5, the adhesive 25 may be located near the 4 corners of the VCSEL substrate 2 having the square shape.

The adhesive 25 may be located at 5 or more positions. Further, the adhesive 25 may be located over the entire periphery of the VCSEL substrate 2 and the micro lens array 3. In other words, the VCSEL 2 may be sealed with the micro lens array 3.

Figure 6:
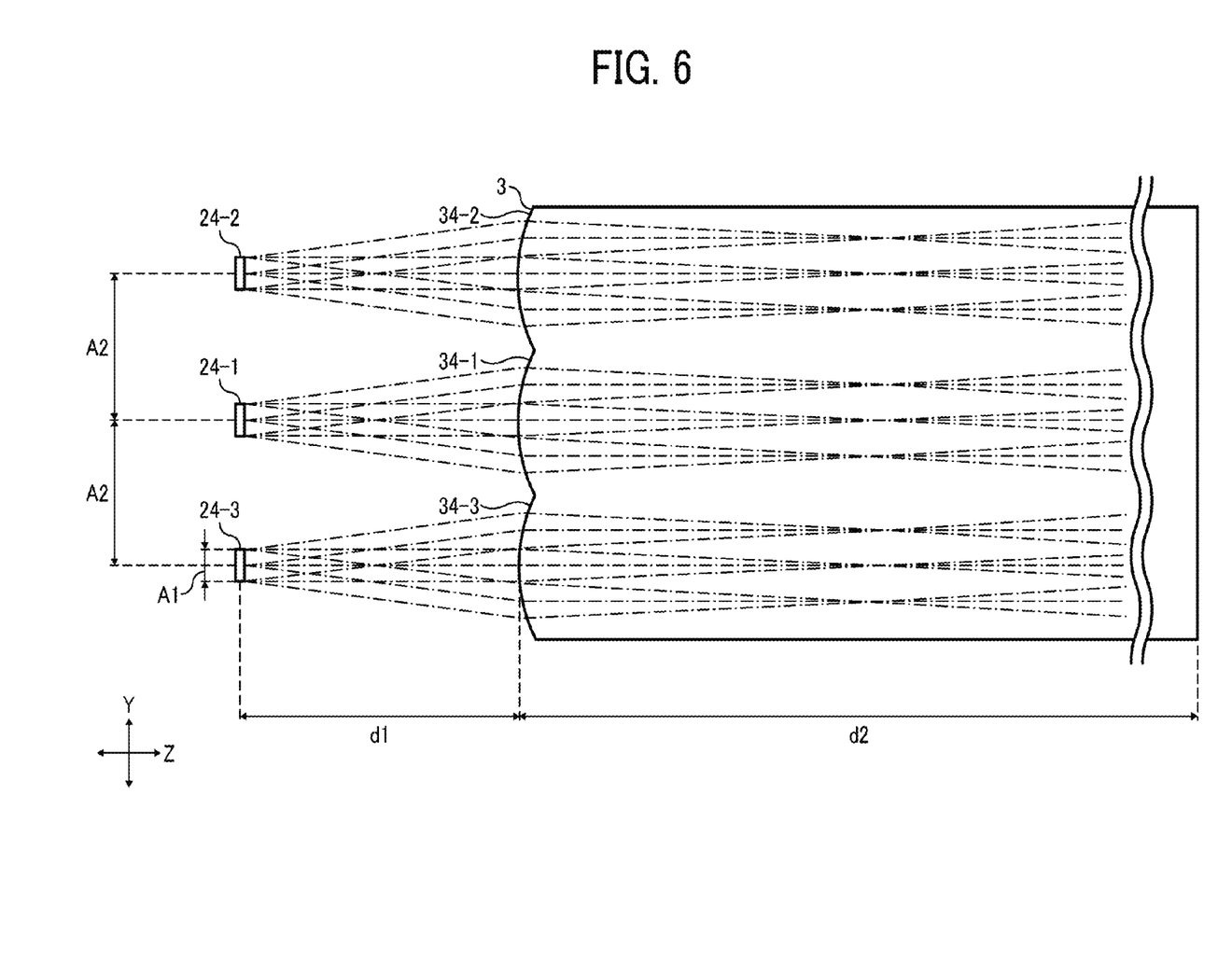
FIG. 6 is a schematic view of light path illustrating a light flux from the VCSEL entering the micro lens array and the condenser lens equipped in the laser apparatus.

FIG. 6 shows light emitted from light emitting points 24-1 to 24-3 among the light emitting points 24-$k$ entering the condenser lens 4 through the micro lens array 3. The light emitting point 24-1 is located at the center of the light emitting region. The light emitting points 24-2 and 24-3 are two points located closest to the light emitting point 24-1 among the light emitting points 24-$k$. Light fluxes emitted from the light emitting points 24-1 to 24-3 enter the lenses 34-1 to 34-3, respectively.

The light fluxes from the light emitting points 24-1 to 24-3 are collimated by the lenses 34-1 to 34-3. Since the micro lens array 3 has a focal length of 0.1 mm (f=0.1) and each of the light emitting points 24-1 to 24-3 has a diameter of 10 μm, the light fluxes after collimated are not completely parallel light fluxes and are loose diverging light fluxes.

Figure 7:
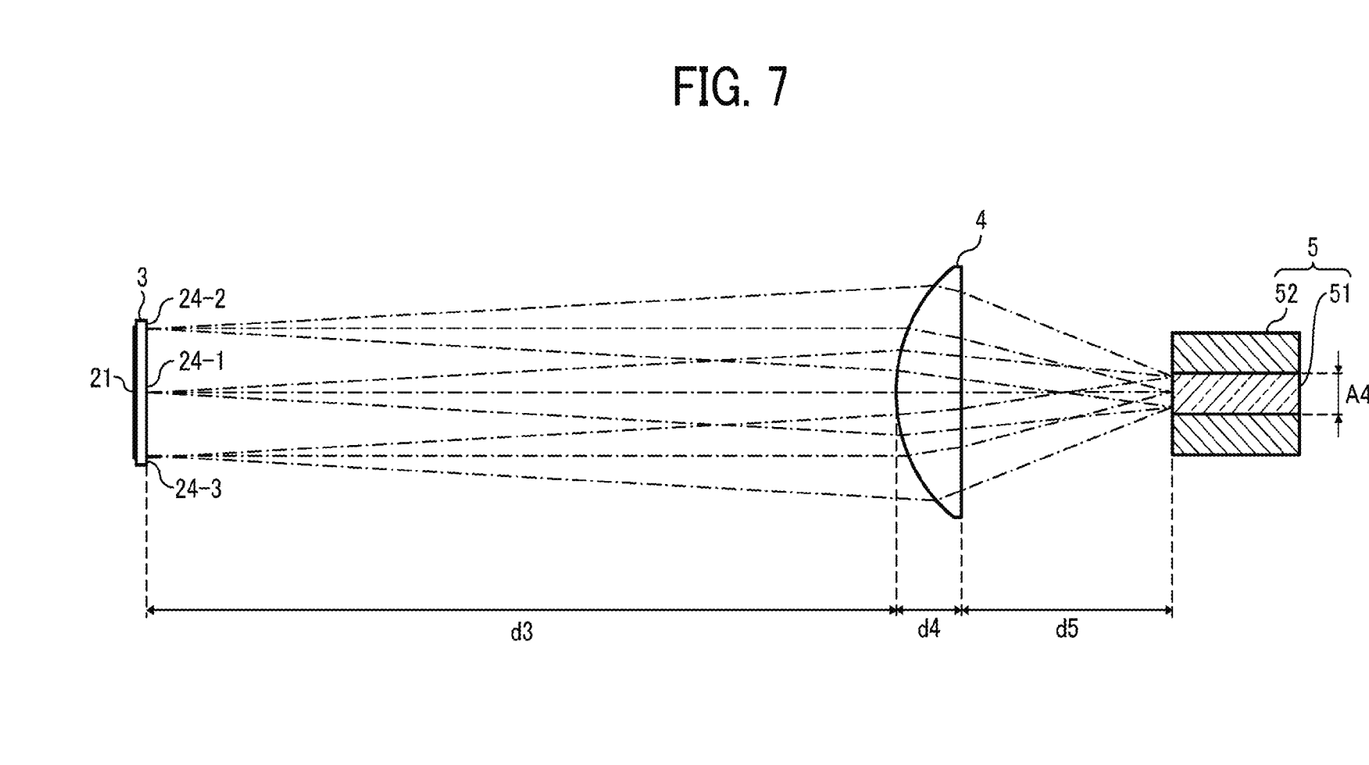
FIG. 7 is an optical layout illustrating a light flux emitted from the surface-emitting light source entering an optical fiber equipped in the laser apparatus.

As shown in FIG. 7, the light fluxes collimated and emitted by the micro lens array 3 are condensed by the condenser lens 4 to an incident end of the optical fiber 5. The condenser lens 4 is an example of condenser optical systems. The condenser lens 4 is, e.g., a glass mold aspherical lens.

Figure 8:
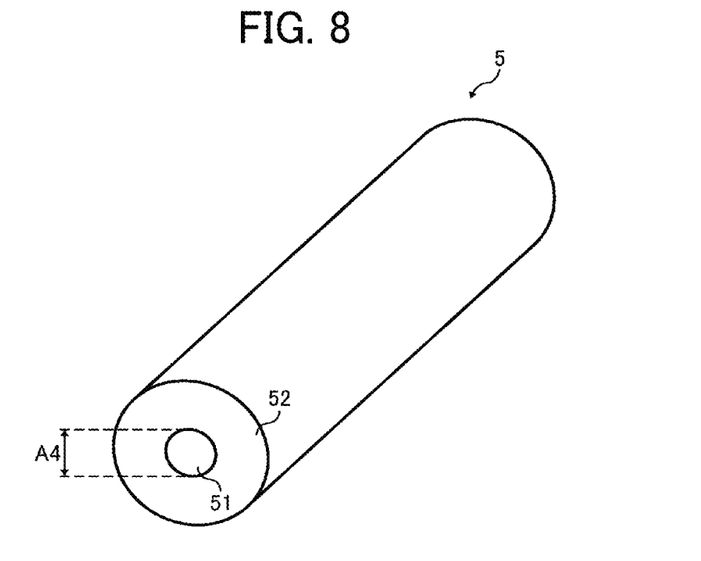
FIG. 8 is a perspective view illustrating a cross section of the optical fiber.

As shown in FIGS. 7 and 8, the optical fiber 5 is equipped with a core 51 and a clad 52 covering the periphery thereof. The optical fiber 5 is a single core fiber, and all the light fluxes from the VCSEL 2 enter the same core 51. The optical fiber 5 transmits the light flux by total reflection due to a difference of refractive index between the core 51 and the clad 52. Therefore, a light flux needs entering the optical fiber 5 at an incident angle (hereinafter referred to as "fiber NA" as well) so as to make a total reflection.

A light beam needs entering the optical fiber 5 such that the largest angle among incident angles of the light beams entering the optical fiber 5 is made smaller than the angle determined by the fiber NA. The fiber NA of the optical fiber 5 in the embodiment is 0.39, and a capturable angle is ±22.9°. Therefore, each of the optical elements is disposed so as to have an incident angle to the optical fiber 5 of ±22.9° or below.

Locations of each of the optical elements, i.e., optical systems in the embodiment are shown in Table 1. A1 represents a diameter of each of the light emitting points 24-$k$, A2 represents an interval between each of the light emitting points 24-$k$, A3 represents a diameter of the light emitting region 22, and A4 represents a diameter of the core 51.

d1 represents a distance from the VCSEL 2 to the micro lens array 3, and d2 represents a thickness of the micro lens array 3. d3 represents a distance from the micro lens array 3 to an incident surface of the condenser lens 4, d4 represents a thickness of the condenser lens 4, and d5 represents a distance from an emission surface of the condenser lens 4 to the optical fiber.

TABLE 1

| | |
|---|---|
| A1 (μm) | 9 |
| A2 (μm) | 48 |
| A3 (mm) | 8.9 |
| A4 (mm) | 1.50 |
| d1 (mm) | 0.09 |
| d2 (mm) | 1.036 |
| d3 (mm) | 10.0 |
| d4 (mm) | 5.3 |
| d5 (mm) | 8.97 |
| Maximum Incident Angle (deg) | 22.9 |
| Refractive Index of Condenser lens | 1.516 |
| Focal Length of Condenser Lens (mm) | 12.00 |

The entire optical system has a magnification of 153 times. A beam spot diameter on the optical fiber 5 is approximately a product of the size A1 of the light emitting point 24-$k$ and the magnification. The beam spot diameter in the embodiment is $\phi 9$ μm×153=1.38 mm, and the core 51 has a large diameter A4 of 1.50 mm.

Namely, the laser apparatus of the embodiment of the present invention satisfies the following relation:

$$A1 \times m < A4$$

wherein A1 represents a diameter of each of the light emitting points 24-$k$, m represents a magnification of the entire system, and A4 represents a diameter of the core 51. The optical fiber 5 having such a core diameter has high light use efficiency.

Table 2 shows liner expansion coefficients of the VCSEL substrate 21, the micro lens array 3 and the adhesive 25 in the embodiment. The micro lens array 3 is formed of a material having a liner expansion coefficient approximately one digit less than that of the VCSEL substrate 21. Namely, the micro lens array 3 has little expansion for heat generated by the VCSEL 2.

TABLE 2

| | Liner Expansion Coefficient [/K] |
|---|---|
| VCSEL Substrate (GaAs) | $5.70 \times 10^{-6}$ |
| Micro Lens Array (Synthetic Quartz) | $5.10 \times 10^{-7}$ |
| Adhesive (Epoxy) | $6.00 \times 10^{-5}$ |

Figure 9:
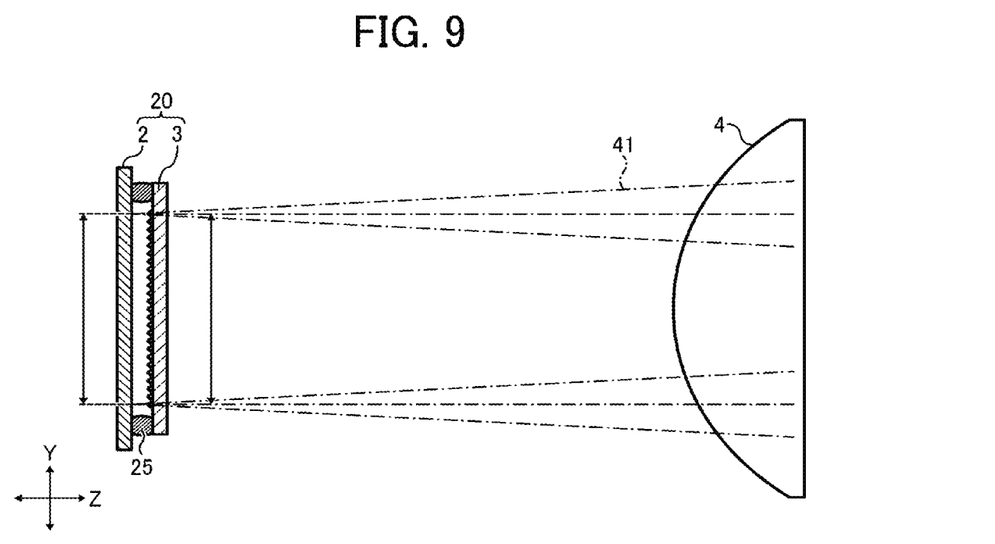
FIG. 9 is a schematic view of light path illustrating a light flux entering the condenser optical system from the VCSEL when a VCSEL substrate the VCSEL is formed on has no variation of temperature.

•Relation Between Configuration of Surface-Emitting Light Source and Light Use Efficiency As shown in FIG. 9, when the surface-emitting light source 20 has a temperature equivalent to a room temperature, light fluxes emitted from the surface-emitting light source 20 are loose diverging light fluxes 41. Since XY coordinates of each of the light emitting points 24-$k$ and each of the lenses 34-$k$ are identical with each other, the main light beam is parallel to a z-axis. The z-axis is in a direction parallel to an optical axis of the surface-emitting light source 20.

Figure 10:
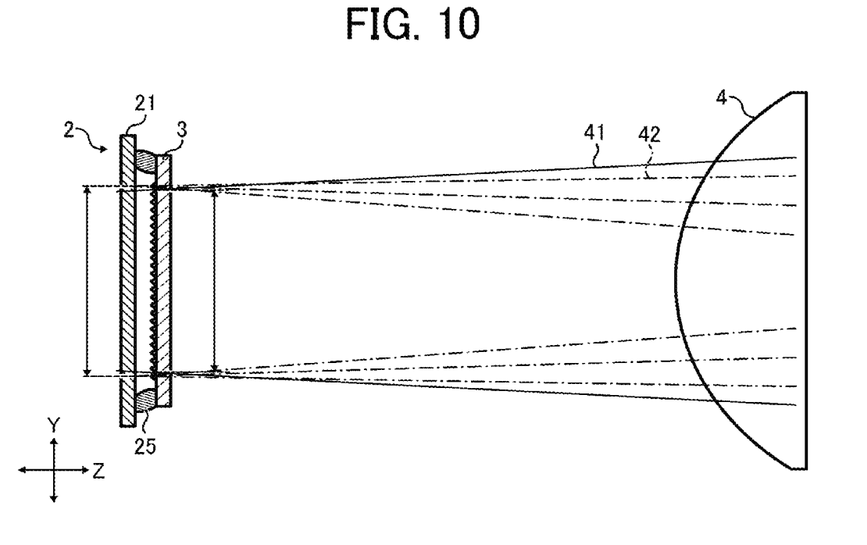
FIG. 10 is a schematic view of light path illustrating a light flux entering the condenser optical system from the VCSEL when the VCSEL substrate increases in temperature in the case where the VCSEL substrate has a linear expansion coefficient larger than that of the micro lens array.

As FIG. 10 shows, when the surface-emitting light source 20 continues to light, heat generated thereby increases temperatures of the VCSEL substrate 21 and the micro lens array 3, thus expanding the VCSEL substrate 21 and the micro lens array 3. Since the VCSEL substrate 21 and the micro lens array 3 have different linear expansion coefficients, the XY coordinates of the light emitting points 24-$k$ and the lenses 34-$k$ are not identical with each other. Since the center of the light emitting region 22 has the highest temperature, the outer from the center, the displacement between the VCSEL substrate 21 and the micro lens array 3 becomes larger.

In the embodiment, since the VCSEL substrate 21 has a linear expansion coefficient larger than that of the micro lens array 3, the VCSEL substrate 21 expands larger as the temperature increases than the micro lens array 3. Therefore, a light flux 42 entering the lens 34-$k$ from the light emitting point 24-$k$ near the outside of the light emitting region 22 passes while slightly curving toward the center of the light emitting region 22, i.e., to an optical axis of the VCSEL 2. Therefore, the whole light beams converge more compared to when the temperature is equivalent to a room temperature.

Figure 11:
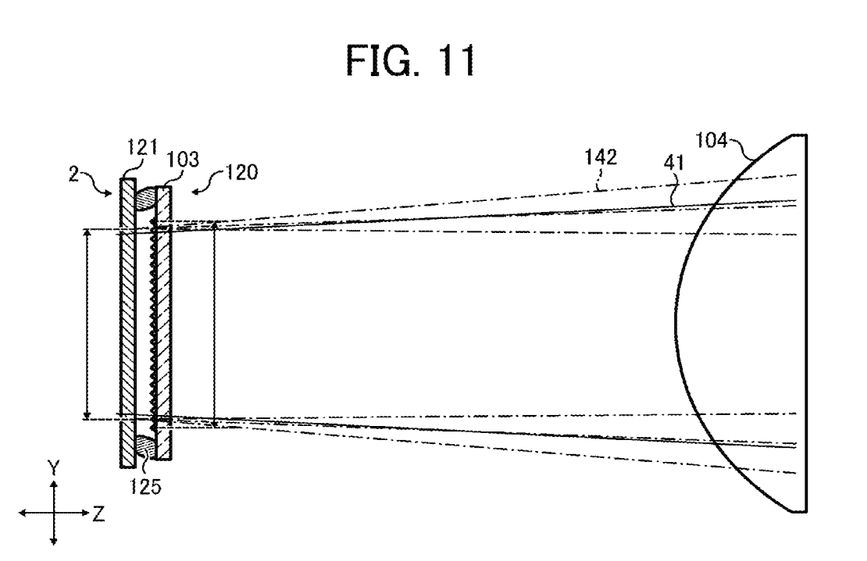
FIG. 11 is a schematic view of light path illustrating a light flux entering the condenser optical system from the VCSEL when the VCSEL substrate increases in temperature in the case where the VCSEL substrate has a linear expansion coefficient smaller than that of the micro lens array, which is a comparative example of the surface-emitting light source.

FIG. 11 shows a light flux 142 when a VCSEL substrate 121 has a linear expansion coefficient smaller than that of a micro lens array 103. The micro lens array 103 is formed of, e.g., polycarbonate. Since the micro lens array 103 expands more than the VCSEL substrate 121 due to increase in temperature, the light flux 142 is refracted in a direction away from an optical axis of a VCSEL 102.

Therefore, the VCSEL 102 is mostly formed of divergent light fluxes, and the light fluxes 142 extend outside of the condenser lens 104. When the light fluxes 142 extend outside of the condenser lens 104, a shading eclipse occurs at the condenser lens 104, resulting in possible decrease of light quantity. In addition, an incident angle of the light flux to the optical fiber becomes large and exceeds the fiber NA, resulting in inability thereof to enter the optical fiber.

When the VCSEL substrate 21 has a linear expansion coefficient larger than that of the micro lens array 3, all light beams are converged to obtain high light use efficiency even when the VCSEL substrate 21 increases in temperature. Particularly, the VCSEL 2 integrating the light emitting points 24-$k$ tends to generate heat more than other lasers, but the above-described configuration can prevent the light use efficiency from lowering.

•Displacement of Micro Lens Array 3 when Temperature Varies

Figure 12:
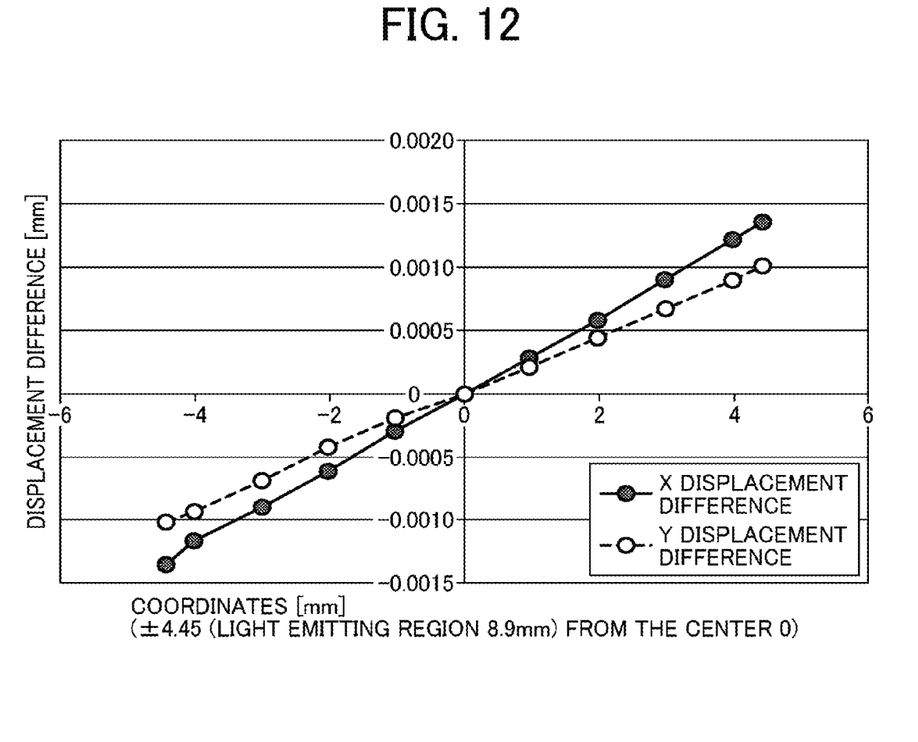
FIG. 12 is a diagram showing a displacement of the micro lens array in a XY direction when the VCSEL has a temperature of 50° C.

FIG. 12 is a diagram simulating a difference of displacements between the VCSEL substrate 21 and the micro lens array 3 when the temperature of the VCSEL substrate 21 changes from 25° C. to 50° C. when continuously used. The horizontal axis is a coordinate with the center of the light emitting region 22 as a reference and the vertical axis is a coordinate for showing the difference of displacements.

When the temperature of the VCSEL substrate 21 is 50° C., the difference of displacements becomes larger as it is leaving from the center of the light emitting region 22. A maximum displacement in X direction is 1.5 μm and a maximum displacement in Y direction is 1 μm. However, since the displaced position is the outermost side of the light emitting region 22, the influence upon the light use efficiency is small.

Figure 13:
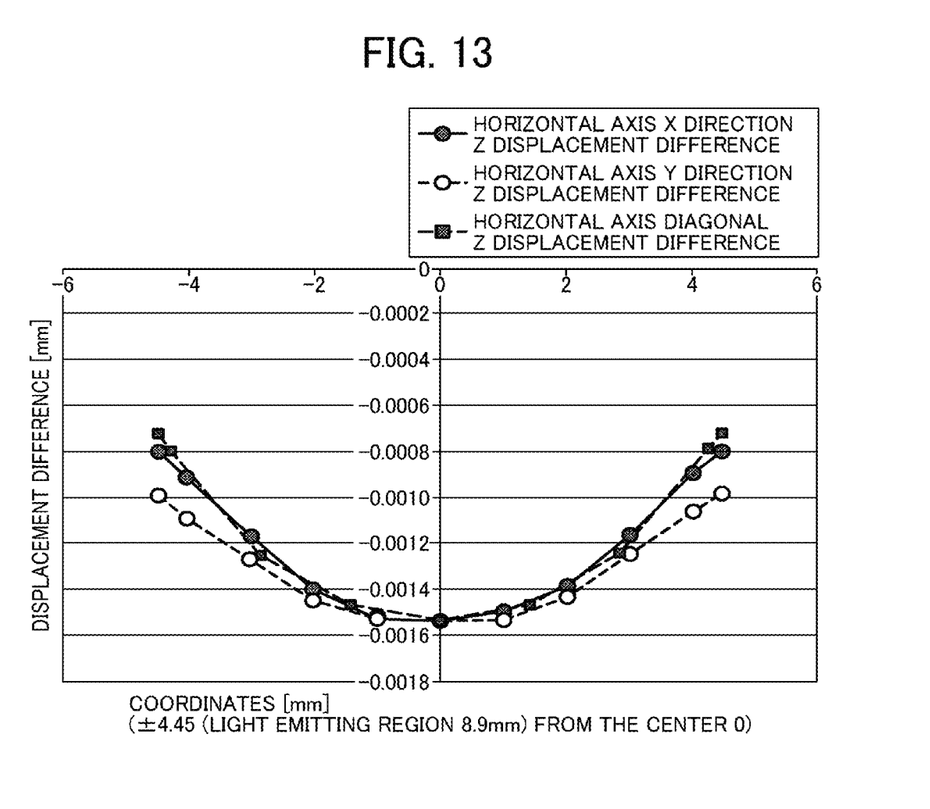
FIG. 13 is a diagram showing a displacement of the micro lens array in an optical axis direction when the VCSEL has a temperature of 50° C.
Figure 14:
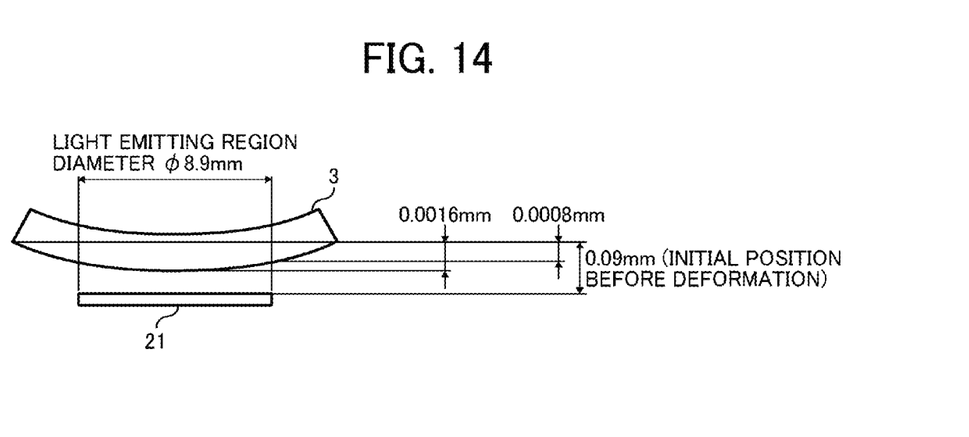
FIG. 14 is a schematic view illustrating a displacement of the micro lens array in the optical axis direction.

As shown in FIGS. 13 and 14, in an optical axis, the micro lens array 3 is deformed so as to be away from the VCSEL substrate 21 as it becomes closer to the outside of the light emitting region 22. In the embodiment, the light use efficiency decreases by as small as about 3% when the temperature varies from 25° C. to 50° C. even when considering deformation of the micro lens array 3.

According to the embodiment mentioned above, when the lens array has a liner expansion coefficient not larger than that of the VCSEL substrate, the optical fiber has high light use efficiency even when a light emitting point generates heat.

Having now fully described the invention, it will be apparent to one of ordinary skill in the art that many changes and modifications can be made thereto without departing from the spirit and scope of the invention as set forth therein.

What is claimed is:

1. A surface-emitting light source, comprising:
a substrate including a light emitting region where plural light emitting points are disposed and a non-light emitting region located around the light emitting region; and
a lens array including plural lenses and a non-lens region around the plural lenses, wherein
the substrate and the lens array are directly bonded with each other at the non-light emitting region and the non-lens region such that the plural light emitting points and the plural lenses face each other, and
the lens array has a linear expansion coefficient not greater than a linear expansion coefficient of the substrate.

2. The surface-emitting light source of claim 1, wherein a surface top of each of the plural lenses matches an optical axis of each of the plural light emitting points.

3. The surface-emitting light source of claim 1, wherein the non-light emitting region and the non-lens region are bonded with each other with an adhesive at not less than four portions symmetrical with respect to a center of the light emitting points.

4. The surface-emitting light source of claim 1, wherein each of the plural lenses has a convex surface facing each corresponding one of the light emitting points.

5. A laser apparatus, comprising:
a surface-emitting light source including
a substrate including a light emitting region where plural light emitting points are disposed and a non-light emitting region located around the light emitting region; and
a lens array including plural lenses and a non-lens region around the plural lenses, wherein
the substrate and the lens array are directly bonded with each other at the non-light emitting region and the non-lens region such that the plural light emitting points and the plural lenses face each other, and
the lens array has a linear expansion coefficient not greater than a linear expansion coefficient of the substrate;
a condenser optical system to condense plural light fluxes emitted from the surface-emitting light source; and
an optical fiber to receive the condensed plural light fluxes.

6. The laser apparatus of claim 5, wherein the optical fiber comprises a core and the following relation is satisfied:

$$A1 \times m < A4$$

wherein A1 represents a diameter of each of the light emitting points, m represents a magnification of the entire system, and A4 represents a diameter of the core.

7. The laser apparatus of claim 5, further comprising:
a heat diffusion plate located facing a surface of the substrate opposite to the surface the lens array is bonded to; and
a Peltier element located adjacent to the heat diffusion plate.

8. The laser apparatus of claim 6, further comprising:
a heat diffusion plate located facing a surface of the substrate opposite to the surface the lens array is bonded to; and
a Peltier element located adjacent to the heat diffusion plate.

9. The laser apparatus of claim 5, further comprising:
a heat sink;
a heat diffusion plate located facing a surface of the substrate opposite to the surface the lens array is bonded to; and
a Peltier element located adjacent to the heat diffusion plate, wherein
the Peltier element and the heat sink are joined together to an outer surface of the heat diffusion plate in this order.

10. The surface-emitting light source of claim 1, wherein an entirety of the substrate is parallel to an entirety of the lens array.

11. The surface-emitting light source of claim 1, wherein the plural light emitting points are disposed on a surface of the substrate, and
the substrate of the light source and the lens array are directly bounded with each other such that the non-lens region of the lens array faces the non-light emitting region, in which the plural light emitting points are not disposed, on the surface of the substrate.

* * * * *